United States Patent [19]
Brannon et al.

[11] Patent Number: 5,206,605
[45] Date of Patent: Apr. 27, 1993

[54] HIGH BREAKDOWN VOLTAGE/LOW INPUT CAPACITANCE AMPLIFIER

[75] Inventors: Craig M. Brannon, Golden Valley; John J. Price, Edina, both of Minn.

[73] Assignee: VTC, Inc., Bloomington, Minn.

[21] Appl. No.: 850,672

[22] Filed: Mar. 13, 1992

[51] Int. Cl.⁵ .............................................. H03F 3/45
[52] U.S. Cl. ................................. 330/252; 330/298; 307/530
[58] Field of Search ............ 330/207 P, 252, 261, 330/298; 307/530; 365/189.01, 189.09, 189.11

[56] References Cited

U.S. PATENT DOCUMENTS

| | | | |
|---|---|---|---|
| 3,462,697 | 8/1969 | Gilbert | 330/300 X |
| 3,541,464 | 11/1970 | Slemmer | 330/252 |
| 3,586,988 | 6/1971 | Weekes | 330/69 X |
| 4,543,538 | 9/1985 | Fay | 330/260 |
| 4,549,147 | 10/1985 | Kondo | 330/297 |
| 4,714,896 | 12/1987 | Addis | 330/261 |
| 5,075,636 | 12/1991 | Addis et al. | 330/261 X |

Primary Examiner—Steven Mottola
Attorney, Agent, or Firm—Kinney & Lange

[57] ABSTRACT

An amplifier includes first and second transistors each of which has a conduction path, with first and second conduction path terminals, and a control terminal for controlling conduction through the conduction path. The amplifier also includes a current source and voltage reference terminal for being coupled to a voltage reference. A first Schottky diode has an intrinsic series resistance and is coupled between the second conduction path terminal of the first transistor and the current source. A second Schottky diode has an intrinsic series resistance and is coupled between the second conduction path terminal of the second transistor and the current source.

24 Claims, 4 Drawing Sheets

HIGH BREAKDOWN VOLTAGE/LOW INPUT CAPACITANCE AMPLIFIER

BACKGROUND OF THE INVENTION

The present invention deals with an amplifier. More particularly, the present invention deals with a high breakdown voltage amplifier which has low input capacitance.

Magnetic disk drives often have a read/write head which is used for both writing data to a magnetic disk in the magnetic disk drive and reading data from the magnetic disk. During a write operation, a write signal is provided to the read/write head from a write control circuit. The write signal represents data to be written to, or encoded on, the magnetic disk.

During a read operation, the read/write head senses flux reversals from the magnetic disk. The flux reversals represent data encoded on the magnetic disk during a write operation. Based on the flux reversals, the read/write head provides a read signal to a read circuit. The read signal is representative of the data encoded on the magnetic disk. The read circuit amplifies the read signal and recovers the data. The read circuit then provides the data to a magnetic disk controller for further processing.

In a magnetic disk drive in which the read/write head is used to both write data to the disk and read data from the disk, the read/write head is coupled, at all times, to the write circuitry and to the read circuitry. This configuration can cause several problems. For example, during a write operation, it is desirable to achieve a large voltage swing across the read/write head. The large voltage swing ensures that currents switch quickly through the read/write head. This is important because a typical inductive read/write head provides a high inductive load to the write circuit.

However, the read/write head is not only coupled to the write circuitry. Rather, it is also coupled to the read circuitry. Typically, the first circuit to which the read/write head is coupled in the read circuitry is a read amplifier which amplifies the read signal provided by the read/write head. The read amplifier is typically a standard differential common emitter amplifier. Therefore, when the large voltage swings are applied to the read/write head during a write operation, those same voltage swings are also applied to the inputs of the read amplifier in the read circuit. Such large voltage swings can cause the input transistors in the read amplifier to break down in the reverse direction. Such a breakdown causes the beta of the transistors to degrade. Hence, noise increases and the gain of the amplifier is reduced over time.

In the past, pn junction diodes have been used in an effort to solve the problem. The pn junction diodes were placed in the emitter legs of the read amplifier to increase the breakdown voltage required for the transistors to break down in the reverse direction. However, the reverse breakdown voltage of a pn junction diode is only typically about six volts. Thus, even with the pn junction diodes incorporated in the amplifier, it was still difficult to apply the large voltage swings without damaging the read amplifier.

It is also important in the operation of the read and write circuitry that the read amplifier have a low input capacitance. Even with the pn junction diodes in the emitter legs of the read amplifier, the input capacitance of the read amplifier is still relatively high.

SUMMARY OF THE INVENTION

In the present invention, an amplifier has first and second transistors, each of which has a conduction path with first and second conduction path terminals, and a control terminal for controlling conduction through the conduction path. The amplifier also includes a current source and voltage reference terminal for being coupled to a voltage reference. A first Schottky diode, having an intrinsic series resistance, is coupled between the second conduction path terminal of the first transistor and the current source. A second Schottky diode, having an intrinsic series resistance, is coupled between the second conduction path terminal of the second transistor and the current source.

DETAILED DESCRIPTION OF THE PREFERRED EMBODIMENTS

Figure 1:
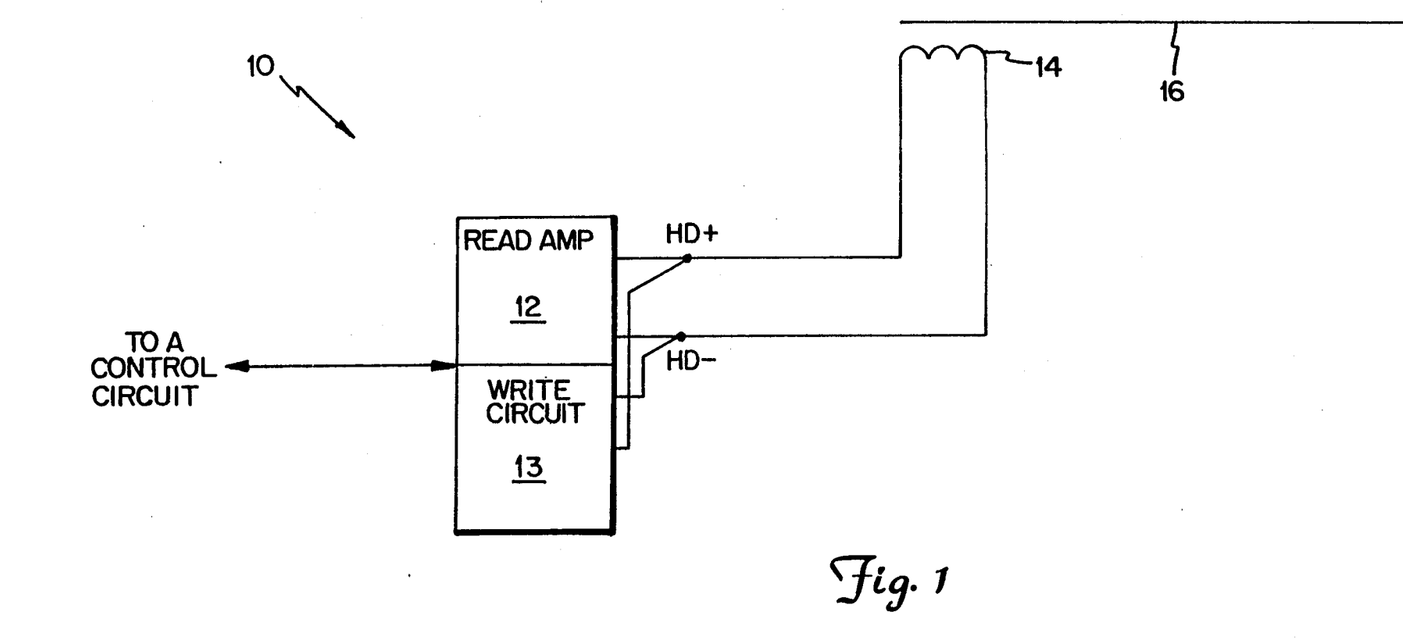
FIG. 1 is a block diagram showing a portion of a disk drive.

FIG. 1 is a block diagram of a portion of a magnetic disk drive 10. Magnetic disk drive 10 includes a control circuit, not shown, read amplifier 12, write circuit 13, inductive read/write head 14, and magnetic disk 16. In operation, the control circuit controls read amplifier 12 and write circuit 13 to write data to disk 16 and read data from disk 16.

During a write operation, the control circuit provides data to the write circuit 13. Write circuit 13 provides a write signal at read/write head terminals HD+ and HD−. The write signal is provided in the form of a voltage across terminals HD+ and HD−. The write voltage varies with the data provided by the control circuit. Based on the write signal provided at terminals HD+ and HD−, inductive head 14 encodes data on magnetic disk 16.

Inductive head 14 is typically a ferrite head. Therefore, inductive head 14 provides a large inductive load to the write circuit at terminals HD+ and HD−. In inductive head 14, it is typically desirable to switch approximately 28 to 40 milliamps of current when performing a write cycle. The swing voltage applied across terminals HD+ and HD− can be defined as:

$$V = L \frac{di}{dt}$$

where L=the load of the inductive head. Since it is desirable to have quick current switching in the inductive head, it is desirable to maximize the change of current with respect to time, (i.e., the di/dt term).

It is thus desirable to provide large voltage swings in the write signal across terminals HD+ and HD − in order to ensure that the current switches quickly through inductive head 14. Such large voltage swings and quickly switching currents provide the best results in encoding data on magnetic disk 16.

During a read operation, inductive head 14 senses magnetically encoded data on magnetic disk 16. Inductive head 14 provides a read signal at terminals HD+ and HD− which is representative of the data encoded on disk 16. The read signal is applied to read amplifier 12 and is then provided to the control circuit. The control circuit decodes and recovers data from the read signal and uses that data in subsequent processing operations.

Figure 2:
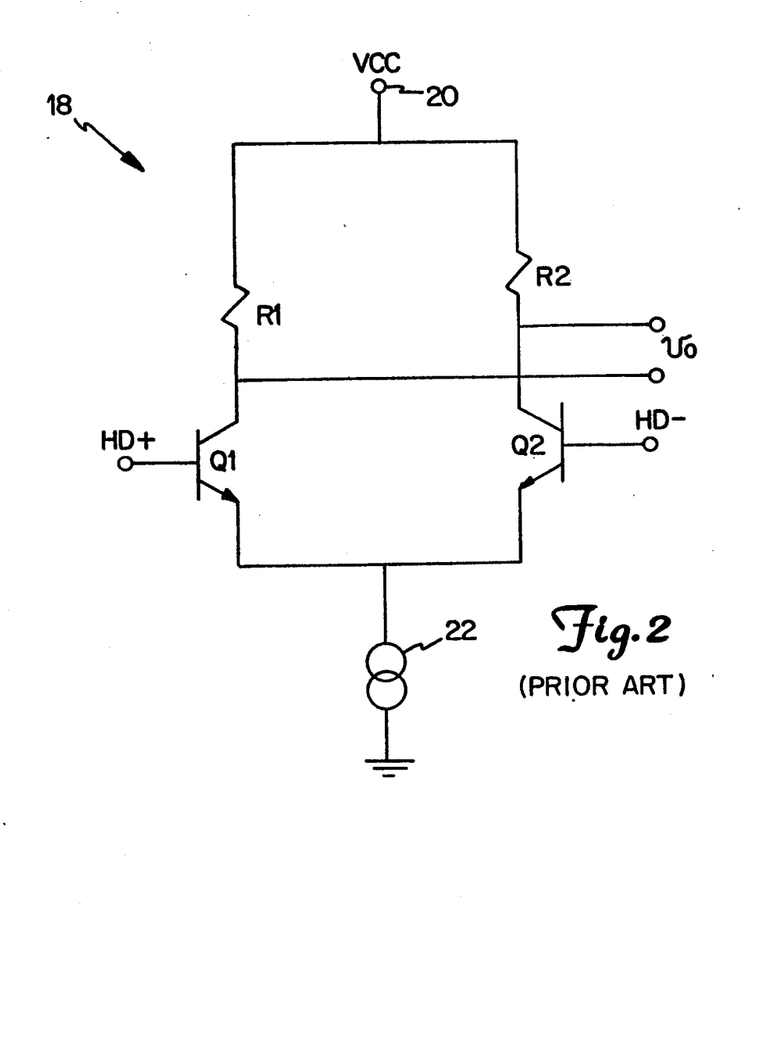
FIG. 2 is a schematic diagram of a read amplifier of the prior art.

FIG. 2 is a schematic diagram of a read amplifier 18 of the prior art. Read amplifier 18 is a standard differential common emitter amplifier which includes a voltage reference terminal 20 suitable for being coupled to a voltage reference, such as VCC. Read amplifier 18 also includes resistors R1 and R2, transistors Q1 and Q2 and current source 22.

The base terminals of transistors Q1 and Q2 are connected to terminals HD+ and HD− which are, in turn, connected across inductive head 14. During a read operation, the read signal is provided at terminals HD+ and HD− in the form of a differential voltage representative of encoded data on magnetic disk 16. The differential voltage is amplified and provided as an output $v_0$.

However, during a write operation, the large voltage swings used to write data, through inductive head 14, to magnetic disk 16, are applied to the base terminals of transistors Q1 and Q2. If the voltage differential applied to the HD+ and HD− terminals is large enough, the base emitter junction of one of the transistors, for example transistor Q2, can become forward biased. This can cause the base-emitter junction of transistor Q1 to break down in the reverse direction. Such a breakdown causes degradation of the beta of transistor Q1. This causes the gain in the amplifier to be reduced and the noise in the amplifier to increase over time. Such damage to read amplifier 18 is undesirable.

Figure 3:
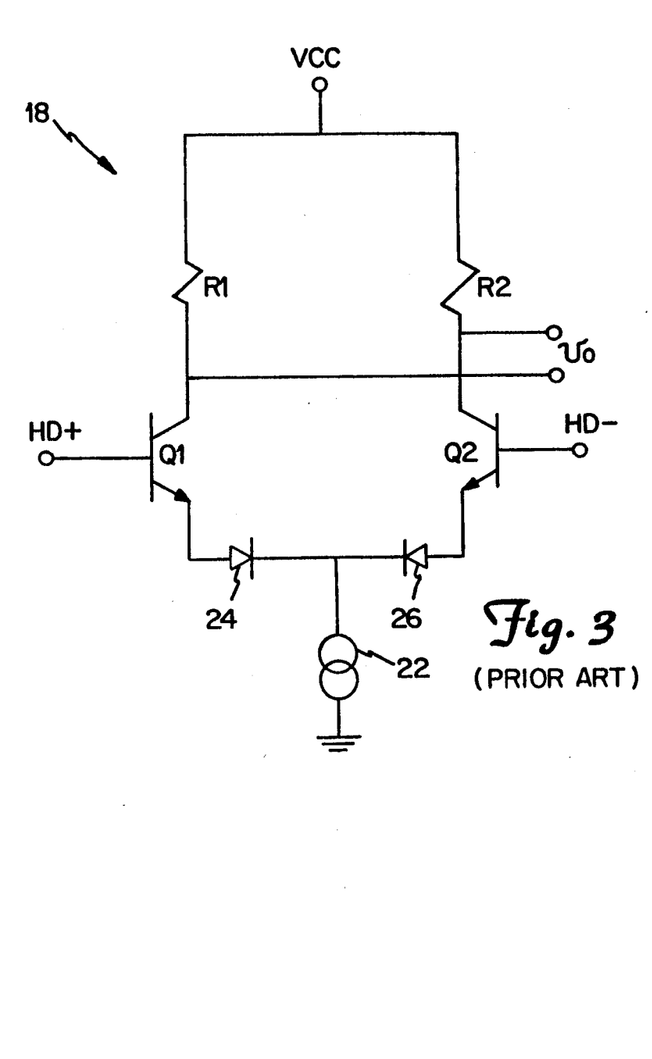
FIG. 3 is a schematic diagram of a read amplifier of the prior art.

FIG. 3 shows a read amplifier of the prior art which is substantially the same as the amplifier shown in FIG. 2 except that it includes two protection diodes 24 and 26 in the emitter legs of the amplifier. This configuration provides some protection against damage to the beta of the transistors in amplifier 18. In other words, if transistor Q2 becomes forward biased, an additional diode drop is imposed between transistor Q2 and the leg of the amplifier containing transistor Q1. Thus, diode 26 must also become forward biased. Then, there is additional protection in that diode 24 must break down in the reverse direction before transistor Q1 can become affected.

While this configuration does provide additional protection, the reverse breakdown voltage of the regular pn junction diode 24 is only approximately six volts. Therefore, there is still a strong possibility that it could break down in the reverse direction. Hence, it is also quite possible that damage could result to the beta of transistor Q1. Further, while the amplifier configuration shown in FIG. 3 provides some protection, the input capacitance of the amplifier is quite high.

Figure 4:
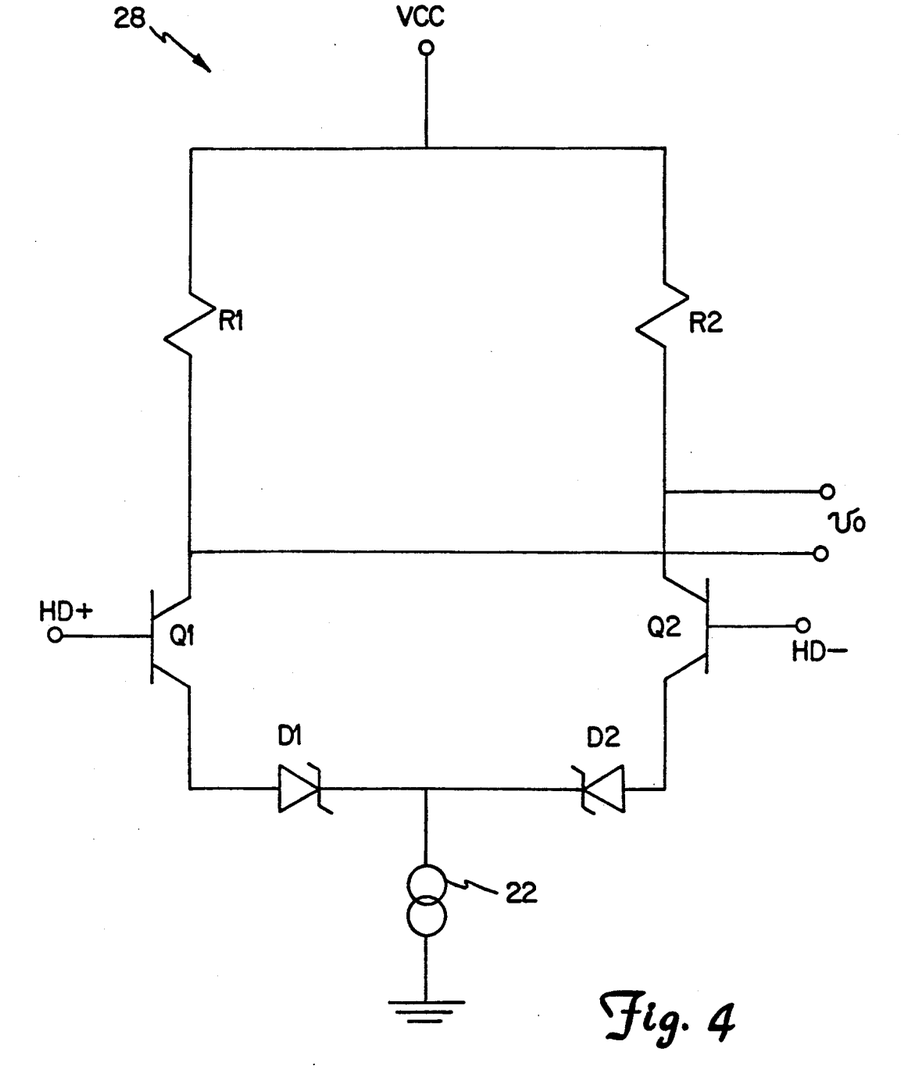
FIG. 4 is a schematic diagram of an amplifier according to the present invention.

FIG. 4 shows a read amplifier 28 of the present invention. Amplifier 28 is similar to amplifier 18, shown in FIG. 3, except that the pn junction diodes 24 and 26 in the emitter legs of the amplifier have been replaced by Schottky diodes D1 and D2. Such a configuration provides considerable advantages over the configuration shown in FIG. 3. For example, the reverse breakdown voltage of a Schottky diode is approximately 15 volts.

Thus, Schottky diodes D1 and D2 in the emitter legs of amplifier 28 provide considerably more protection to the transistors Q1 and Q2 in the amplifier during a write cycle. In other words, in order to damage the transistor devices Q1 and Q2, the voltage swing across terminals HD+ and HD− during a write cycle must be much greater. This allows greater voltage swings across the inductive head 14 during a write cycle and therefore the configuration shown in FIG. 4 allows the write circuit to provide quicker switching currents in inductive head 14.

Further, Schottky diodes D1 and D2 are metal-type junction diodes. Therefore, they are devices which have lower capacitance than normal pn junction diodes. By using Schottky diodes D1 and D2, amplifier 28 has low input capacitance and a high breakdown voltage.

However, in using the configuration of amplifier 28, shown in FIG. 4, another problem can be encountered. Schottky diodes D1 and D2 have a significant intrinsic series resistance. Further, the intrinsic series resistance of Schottky diodes D1 and D2 is not highly controllable during the fabrication process. Therefore, the intrinsic series resistance of the Schottky diodes can vary significantly. For example, working with a half cell which includes resistor R1, transistor Q1, Schottky diode D1 and current source 22, the gain $A_v$ is defined as follows:

$$A_v = \frac{R1}{2r_e + R_i} \qquad \text{Equation 1}$$

where R1=the resistance value of resistor R1;
$r_e$=the dynamic impedance of Schottky diode D1 and the dynamic impedance of the base-emitter junction of transistor Q1; and
$R_i$=the intrinsic series resistance of Schottky diode D1.

Since $R_i$ is not accurately controllable, and since it also varies with respect to temperature and process variables, and since it, in fact, varies significantly with respect to $r_e$, an accurate gain through the amplifier is very difficult to obtain. Further, any appreciable value of $R_i$ significantly decreases the gain through the amplifier.

Not only does the intrinsic series resistance of Schottky diodes D1 and D2 decrease the gain of the amplifier, but it cannot be accurately compensated for by increasing the collector resistors R1 and R2. The reason is that collector resistors R1 and R2 have temperature coefficients and variations due to the manufacturing process which do not track the intrinsic series resistances of Schottky diodes D1 and D2. The two devices (R1 and D1) are made from different bulk materials in the manufacturing process and therefore the resistivity of resistors R1 and R2 does not accurately track that of Schottky diodes D1 and D2.

Figure 5:
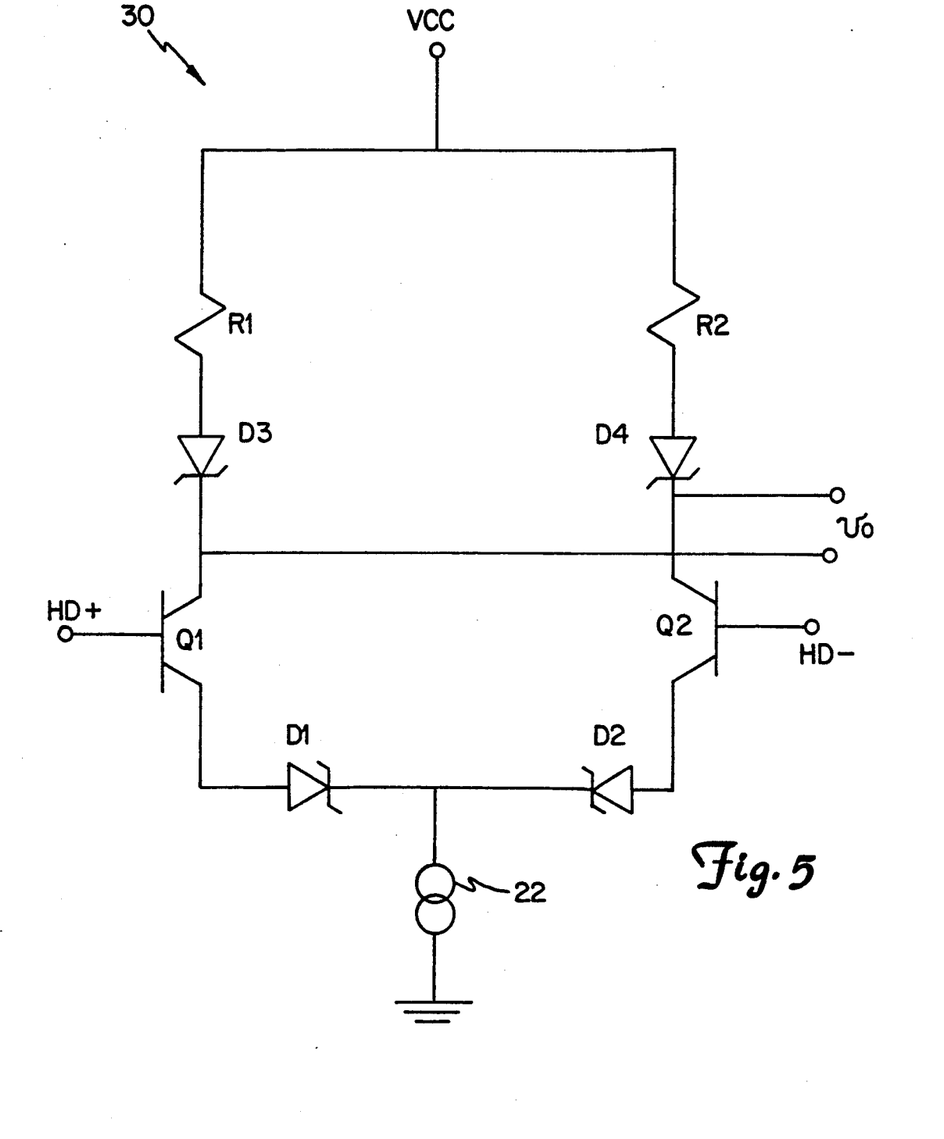
FIG. 5 is a second embodiment of an amplifier according to the present invention.

One solution to the problem of the variable intrinsic series resistance of Schottky diodes D1 and D2 is shown in FIG. 5 which is a schematic diagram of a read amplifier 30 that is similar to amplifier 28 shown in FIG. 4 in all respects, except that two additional Schottky diodes, D3 and D4, are placed in the collector legs of the amplifier. By choosing Schottky diodes D3 and D4 appropriately, the effect of the intrinsic series resistance of Schottky diodes D1 and D2 on gain in the amplifier can essentially be eliminated.

It is generally known that $$R_i \propto \frac{1}{A} \qquad \text{Equation 2}$$

where $R_i$ = the intrinsic series resistance of a Schottky diode; and
A = the area of the Schottky diode.

Thus, if Schottky diodes D1–D4 are fabricated with areas chosen appropriately, the intrinsic series resistance effectively cancels from the gain equation. This can be shown as follows (again working with a half cell R1, D3, Q1, D1 and current source 22):

$$A_v = \frac{R1 + r_{eD3} + R_{iD3}}{r_{eQ1} + r_{eD1} + R_{iD1}} \qquad \text{Equation 3}$$

where $A_v$ = the gain in the amplifier stage;
R1 = the resistance value of resistor R1;
$R_{eD1}$ = the dynamic impedance of Schottky diode D1;
$R_{eD3}$ = the dynamic impedance of Schottky diode D3;
$R_{eQ1}$ = the dynamic impedance of the base-emitter junction of transistor Q1;
$R_{iD1}$ = the intrinsic series resistance of Schottky diode D1; and
$R_{iD3}$ = the intrinsic series resistance of Schottky diode D3.

Since:

$$I_{D1} = I_{Q1} \qquad \text{Equation 4}$$

and, due to base current loss:

$$I_{Q1} \delta I_{D3} \qquad \text{Equation 5}$$

where $I_{D1}$ = the current flowing through Schottky diode D1;
$I_{Q1}$ = the current flowing through the conduction path of transistor Q1; and
$I_{D3}$ = the current flowing through Schottky diode D3;
and since:

$$r_{eD1} = r_{eQ1} \delta r_{eD3} \triangleq r_e \qquad \text{Equation 6}$$

then substituting $r_e$ into the gain equation 3 yields:

$$A_v = \frac{R1 + r_e + R_{iD3}}{2r_e + R_{iD1}} \qquad \text{Equation 7}$$

By letting the area of Schottky diode D3 be equal to the area of Schottky diode D1 divided by the desired gain ($A_v$), $R_{iD3}$ will equal $A_v * R_{iD1}$. Substituting in the gain equation 7 provides:

$$A_v = \frac{R1 + r_e + A_v R_{iD1}}{2r_e + R_{iD1}} \qquad \text{Equation 8}$$

multiplying out provides:

$$A_v(2r_e + R_{iD1}) = R1 + r_e + A_v R_{iD1} \qquad \text{Equation 9}$$

Solving for $A_v$:

$$A_v 2r_e + A_v R_{iD1} = R1 + r_e + A_v R_{iD1} \qquad \text{Equation 10}$$

$$A_v 2r_e = R1 + r_e \qquad \text{Equation 11}$$

$$A_v = \frac{R1 + r_e}{2r_e} \qquad \text{Equation 12}$$

It should also be noted that the current source 22 is fabricated using a resistor which is made in the same fashion as resistor R1. Therefore, the current source tracks temperature and process variations along with resistor R1 to eliminate any adverse effects on gain in the current source.

Therefore, all of the factors that determine gain in the amplifier are proportional to internal resistors of like type. The gain through the amplifier is thus essentially insensitive to process variations and temperature variations. The effects of the intrinsic series resistance of Schottky diodes D1 and D3 are eliminated from the gain equation.

For best results in working with a full cell the following should be true;

$$\frac{A_{D1}}{A_{D3}} = \frac{A_{D2}}{A_{D4}} = A_v \qquad \text{Equation 13}$$

where $A_{D1}$ = the area of Schottky diode D1; and
$A_{D2}$ = the area of Schottky diode D2;
$A_{D3}$ = the area of Schottky diode D3;
$A_{D4}$ = the area of Sohottky diode D4.

With Equation 13 met, the intrinsic series resistance of all four Schottky diodes cancels out of the gain equation for the entire amplifier 30, and the gain is essentially insensitive to process and temperature variations.

In conclusion, the present invention provides Schottky diodes in the emitter paths of a differential read amplifier to protect the transistor devices in the amplifier against large voltage swings on the input pins applied during a write operation. Further, the present invention compensates for variable intrinsic series resistance in the Schottky diodes by placing additional Schottky diodes in the collector paths of the amplifier. Since the intrinsic series resistance of the Schottky diodes is proportional to one over the area of the Schottky diodes, the areas of the Schottky diodes are ratioed so they track one another proportionately. Since the diodes are all fabricated in the same fashion, the intrinsic series resistance in the two sets of diodes changes in essentially the same fashion with respect to temperature and process variables. Thus, the intrinsic series resistance of the Schottky diodes is essentially cancelled out of the gain equation for the amplifier and will not affect gain. In addition, since the Schottky diodes are metal-type junction diodes, they are low capacitance devices. The net result is an amplifier with a high breakdown voltage and low input capacitance wherein the gain of the amplifier is unaffected by the Schottky diodes.

Although the present invention has been described with reference to preferred embodiments, workers skilled in the art will recognize that changes may be made in form and detail without departing from the spirit and scope of the invention.

What is claimed is:
1. An amplifier, comprising:
first and second transistors, each transistor having a conduction path, with first and second conduction path terminals, and a control terminal for controlling conduction through the conduction path;
a current source;
a voltage reference terminal for being coupled to a voltage reference;
a first Schottky diode coupled between the second conduction path terminal of the first transistor and the current source;
a second Schottky diode coupled between the second conduction path terminal of the second transistor and the current source;
a third Schottky diode coupled between the first conduction path terminal of the first transistor and the voltage reference terminal; and
a fourth Schottky diode coupled between the first conduction path terminal of the second transistor and the voltage reference terminal.

2. The amplifier of claim and further comprising:
a first resistive element coupled between the first conduction path terminal of the first transistor and the voltage reference terminal; and
a second resistive element coupled between the first conduction path terminal of the second transistor and the voltage reference terminal.

3. The amplifier of claim 2 wherein the first resistive element is coupled between the third Schottky diode and the voltage reference terminal, and wherein the second resistive element is coupled between the fourth Schottky diode and the voltage reference terminal.

4. The amplifier of claim 1 wherein the first and third Schottky diodes each have an intrinsic series resistance and have related sizes to reduce effects of the intrinsic series resistances on gain of the amplifier.

5. The amplifier of claim 4 wherein the second and fourth Schottky diodes each have an intrinsic series resistance and have related sizes to reduce effects of the intrinsic series resistances on gain of the amplifier.

6. The amplifier of claim 5 wherein each of the Schottky diodes has an area and wherein the area of the first Schottky diode, AD1, the area of the second Schottky diode, AD2, the area of the third Schottky diode, AD3, and the area of the fourth Schottky diode, AD4, are related so that:

$$\frac{A_{D1}}{A_{D3}} = \frac{A_{D2}}{A_{D4}}$$

7. The amplifier of claim 1 wherein the first conduction path terminal of each transistor comprises a collector, wherein the second conduction path terminal of each transistor comprises an emitter, and wherein the control terminal of each transistor comprises a base.

8. The amplifier of claim 1 wherein each of the Schottky diodes has an intrinsic series resistance, and wherein the intrinsic series resistances are related to reduce effects of the series resistance on gain of the amplifier.

9. The amplifier of claim 8 wherein the intrinsic series resistances of the Schottky diodes are ratioed so that effects of the intrinsic series resistances on the gain of the amplifier is substantially eliminated.

10. The amplifier of claim 8 wherein the Schottky diodes have sizes which substantially eliminate effects of variation in the intrinsic series resistances of the Schottky diodes on gain in the amplifier.

11. An amplifier for amplifying read signals provided from a read/write head in a magnetic disc drive, the amplifier comprising:
first and second transistors, each transistor having a conduction path, with first and second conduction path terminals, and a control terminal for controlling conduction through the conduction path, the control terminals being coupled to the read/write head;
a current source;
a voltage reference terminal for being coupled to a voltage reference;
a first Schottky diode having an intrinsic series resistance and being coupled between the second conduction path terminal of the first transistor and the current source;
a second Schottky diode having an intrinsic series resistance and being coupled between the second conduction path terminal of the second transistor and the current source; and
compensation means for compensating for variation in the intrinsic series resistances of the first and second Schottky diodes to reduce effects of the variation on gain of the amplifier.

12. The amplifier of claim 11 wherein the compensation means substantially eliminates effects of the intrinsic series resistances on gain of the amplifier.

13. The amplifier of claim 11 wherein the compensation means comprises:
a third Schottky diode coupled between the first conduction path terminal of the first transistor and the voltage reference terminal; and
a fourth Schottky diode coupled between the first conduction path terminal of the second transistor and the voltage reference terminal.

14. The amplifier of claim 13 and further comprising:
a first resistive element coupled between the first conduction path terminal of the first transistor and the voltage reference terminal; and
a second resistive element coupled between the first conduction path terminal of the second transistor and the voltage reference terminal.

15. The amplifier of claim 14 wherein the first resistive element is coupled between the third Schottky diode and the voltage reference terminal, and wherein the second resistive element is coupled between the fourth Schottky diode and the voltage reference terminal.

16. The amplifier of claim 13 wherein the third Schottky diode has an intrinsic series resistance and wherein the first and third Schottky diodes have related sizes to reduce effects of the intrinsic series resistances on gain of the amplifier.

17. The amplifier of claim 16 wherein the fourth Schottky diode has an intrinsic series resistance and wherein the second and fourth Schottky diodes have related sizes to reduce effects of the intrinsic series resistances on gain of the amplifier.

18. The amplifier of claim 17 wherein each of the Schottky diodes has an area and wherein the area of the first Schottky diodes, AD1, the area of the second Schottky diode, AD2, the area of the third Schottky diode, AD3, and the area of the fourth Schottky diode, AD4, are related so that:

$$\frac{A_{D1}}{A_{D3}} = \frac{A_{D2}}{A_{D4}}$$

19. The amplifier of claim 11 wherein the first conduction path terminal of each transistor comprises a collector, wherein the second conduction path terminal of each transistor comprises an emitter, and wherein the second terminal of each transistor comprises a base.

20. The amplifier of claim 13 wherein each of the Schottky diodes has an intrinsic series resistance, and wherein the intrinsic series resistances are related to reduce effects of the series resistance on gain of the amplifier.

21. The amplifier of claim 20 wherein the intrinsic series resistances of the Schottky diodes are ratioed so effects of the intrinsic series resistances on the gain of the amplifier are substantially eliminated.

22. The amplifier of claim 20 wherein the Schottky diodes have sizes which substantially eliminate effects of variation in the intrinsic series resistances of the Schottky diodes on gain of the amplifier.

23. An amplifier, comprising:
a first NPN transistor having a base, an emitter, and a collector;
a second NPN transistor having a base, an emitter, and a collector;
a current source;
a voltage reference terminal for being coupled to a voltage reference;
a first Schottky diode connected between the emitter of the first transistor and current source;
a second Schottky diode connected between the emitter of the second transistor and the current source;
a third Schottky diode connected between the collector of the first transistor and the voltage reference terminal; and
a fourth Schottky diode connected between the collector of the second transistor and the voltage reference terminal.

24. The amplifier of claim 23 and further comprising:
a first resistor coupled between the third Schottky diode and the voltage reference terminal; and
a second resistor coupled between the fourth Schottky diode and the voltage reference terminal.

* * * * *

UNITED STATES PATENT AND TRADEMARK OFFICE
CERTIFICATE OF CORRECTION

PATENT NO. : 5,206,605
DATED : April 27, 1993
INVENTOR(S) : CRAIG M. BRANNON, JOHN J. PRICE It is certified that error appears in the above-indentified patent and that said Letters Patent is hereby corrected as shown below:

On the title page of the Patent,
  delete [73] Assignee: VTC, Inc., Bloomington, Minn.

insert [73] Assignee: VTC Inc., Bloomington, Minn.

Col. 7, line 18, delete "claim", insert --claim 1--

Col. 9, line 9, delete "second terminal", insert --control terminal--

Signed and Sealed this

Nineteenth Day of April, 1994

BRUCE LEHMAN

*Attest:*

*Attesting Officer*  Commissioner of Patents and Trademarks